United States Patent
Ryu et al.

(10) Patent No.: US 9,606,203 B2
(45) Date of Patent: Mar. 28, 2017

(54) RADIO FREQUENCY (RF) COIL DEVICE, MAGNETIC RESONANCE APPARATUS EMPLOYING THE RF COIL DEVICE, AND METHOD OF OPERATING THE RF COIL DEVICE

(71) Applicant: Samsung Electronics Co., Ltd., Suwon-si (KR)

(72) Inventors: Yeunchul Ryu, Hwaseong-si (KR); Young Beom Kim, Yongin-si (KR); Jaemock Yi, Hwaseong-si (KR); Seong-deok Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 643 days.

(21) Appl. No.: 14/101,999

(22) Filed: Dec. 10, 2013

(65) Prior Publication Data
US 2014/0197833 A1    Jul. 17, 2014

(30) Foreign Application Priority Data
Jan. 16, 2013  (KR) .................. 10-2013-0005114

(51) Int. Cl.
  *G01R 33/34* (2006.01)
  *G01R 33/28* (2006.01)
  *G01R 33/341* (2006.01)
  *G01R 33/3415* (2006.01)
  *G01R 33/345* (2006.01)

(52) U.S. Cl.
  CPC ..... *G01R 33/34084* (2013.01); *G01R 33/288* (2013.01); *G01R 33/341* (2013.01); *G01R 33/3415* (2013.01); *G01R 33/34046* (2013.01); *G01R 33/3453* (2013.01)

(58) Field of Classification Search
  None
  See application file for complete search history.

(56) References Cited

U.S. PATENT DOCUMENTS

| 4,506,224 A | 3/1985 | Krause |
| 6,906,518 B2 | 6/2005 | Leussler |
| 6,958,607 B2 | 10/2005 | Vaughan et al. |
| 6,969,992 B2 | 11/2005 | Vaughan et al. |
| 7,075,301 B2 | 7/2006 | Zhu |

(Continued)

FOREIGN PATENT DOCUMENTS

| EP | 2 500 739 A1 | 9/2012 |
| KR | 10-2009-0053181 A | 5/2009 |
| KR | 10-2011-0054129 A | 5/2011 |
| KR | 10-2012-0015580 A | 2/2012 |
| WO | WO 2004/048990 | 6/2004 |

OTHER PUBLICATIONS

G. Adriany et al. "An Elliptical open-faced transceive array for ultra high field parallel imaging and fMRI applications," *Proceedings of 12th annual meeting ISMRM*, vol. 1, Jan. 1, 2004, pp. 1604.

(Continued)

*Primary Examiner* — Rodney Bonnette
(74) *Attorney, Agent, or Firm* — NSIP Law

(57) ABSTRACT a radio frequency (RF) coil device includes a plurality of RF coil elements configured to generate an RF magnetic field, and a support member configured to support the plurality of RF coil elements so that at least one of the plurality of RF coil elements is movable.

25 Claims, 8 Drawing Sheets

(56) References Cited

U.S. PATENT DOCUMENTS

| | | | |
|---|---|---|---|
| 7,365,542 | B1 | 4/2008 | Rohling et al. |
| 7,397,245 | B2 | 7/2008 | Wohlfarth |
| 7,701,213 | B2 | 4/2010 | Graesslin et al. |
| 7,808,240 | B2 | 10/2010 | Zhu |
| 9,000,766 | B2* | 4/2015 | Chu ................ G01R 33/34084 324/318 |
| 2006/0038564 | A1* | 2/2006 | Findeklee ........ G01R 33/34046 324/318 |
| 2007/0108980 | A1 | 5/2007 | Adriany et al. |
| 2008/0007259 | A1 | 1/2008 | Driemel |
| 2008/0211495 | A1 | 9/2008 | Steckner |
| 2008/0265891 | A1 | 10/2008 | Du et al. |
| 2009/0115418 | A1 | 5/2009 | He et al. |
| 2011/0043208 | A1 | 2/2011 | Leussler |
| 2012/0086452 | A1 | 4/2012 | Dohata et al. |
| 2012/0153956 | A1 | 6/2012 | Driemel |

OTHER PUBLICATIONS

I. Graesslin et al. "Real-Time SAR monitoring to ensure patient safety for parallel transmission systems," *Proceedings of the Joint Annual Meeting ISMRM-ESMRMB*, vol. 15, May 1, 2007, pp. 1086.

Bing Wu et al. "Flexible transceiver array for ultrahigh field human MR imaging," *Magnetic Resonance in Medicine*, vol. 68, No. 4, Jan. 13, 2012, pp. 1332-1338.

Partial European Search Report issued Mar. 25, 2014 in counterpart European Application No. 14151049.5. (10 pages, in English).

S. Orzada et al., "A flexible 8-channel transmit/receive body coil for 7 T human imaging," *Proceedings of the 17th Scientific Meeting & Exhibition of the International Society for Magnetic Resonance in Medicine (ISMRM '09)*, paper 2009, 1 page, 2009, conference held Apr. 18-24, 2009, Honolulu, paper presented on Apr. 21, 2009.

A. Gräβl et al., "Design, Evaluation and Application of a Modular 32 Channel Transmit/Receive Surface Coil Array for Cardiac MRI at 7T," *Proceedings of the 20th Annual Meeting & Exhibition of the International Society for Magnetic Resonance in Medicine (ISMRM '12)*, paper 305, 1 page, 2012, conference held May 5-11, 2012, Melbourne, Australia, paper presented on May 8, 2012.

S. Wolf et al., "SAR Simulations for High-Field MRI: How Much Detail, Effort, and Accuracy is Needed?," *Magnetic Resonance in Medicine*, vol. 69, No. 4, Apr. 2013, pp. 1157-1168, first published online May 18, 2012.

Extended European Search Report issued on May 22, 2014, in counterpart European Patent Application No. 14151049.5 (18 pages, in English).

\* cited by examiner

RADIO FREQUENCY (RF) COIL DEVICE, MAGNETIC RESONANCE APPARATUS EMPLOYING THE RF COIL DEVICE, AND METHOD OF OPERATING THE RF COIL DEVICE

CROSS-REFERENCE TO RELATED APPLICATIONS

This application claims the benefit of Korean Patent Application No. 10-2013-0005114 filed on Jan. 16, 2013, in the Korean Intellectual Property Office, the entire disclosure of which is incorporated herein by reference for all purposes.

BACKGROUND

1. Field

This application relates to a radio frequency (RF) coil device capable of spatial position adjustment of RF coil elements, a magnetic resonance apparatus employing the RF coil device, and a method of operating the RF coil device.

2. Description of Related Art

Magnetic resonance imaging (MRI) apparatuses, magnetic resonance spectroscopy (MRS) apparatuses, and other magnetic resonance apparatuses are well known as magnetic resonance apparatuses that use a nuclear magnetic resonance (NMR) phenomenon.

MRI apparatuses scan a cross-section of a human body using an NMR phenomenon. Since atomic nuclei, such as hydrogen ($^1$H), phosphorus ($^{31}$P), sodium ($^{23}$Na), and carbon isotope ($^{13}$C), existing in a human body have unique rotating magnetic field constants, according to an NMR phenomenon, an image of the inside of the human body may be obtained by applying electromagnetic waves to the magnetization vectors of the atomic nuclei and receiving a magnetic resonance signal generated by a magnetization vector lying in a vertical plane due to resonance.

A radio frequency (RF) coil is used to apply the electromagnetic waves to the human body to make magnetization vectors within the human body resonate and to receive the magnetic resonance signal generated by the resonance of the magnetization vector lying in the vertical plane. The RF coil is referred to as an RF antenna because it transmits electromagnetic waves to cause magnetization vectors to resonate, and receives a magnetic resonance signal. Making a magnetization vector resonate (i.e., a transmission mode) and receiving a magnetic resonance signal (i.e., a reception mode) may be performed together by a single RF coil (i.e., an RF antenna), or the transmission mode and the reception mode may be performed using two separate RF coils, namely, an RF coil for a transmission mode and an RF coil for a reception mode.

A single RF coil that performs both a transmission mode and a reception mode is referred to as a transceiver coil, an RF coil for transmission only is referred to as a transmission RF coil, and an RF coil for reception only is referred to as a reception RF coil. The transmission RF coil is generally installed on a cylindrical (or oval-cylindrical) frame big enough to receive a human body. However, since the reception RF coil is frequently attached to a human body while in use, it is common to form a head coil, a neck coil, a waist coil, and other coils according to the shapes of parts of a human body on which the reception RF coils are to be used.

MRS apparatuses analyze physical, chemical, and biological features of a material using a magnetic resonance phenomenon. Such MRS apparatuses dispose a target within a magnetic field, induce magnetic resonance by directing a pulse RF signal toward the target via a transmission RF coil, and detect a magnetic resonance signal via a reception RF coil disposed around the target. Since different types of atoms within a target generate different magnetic resonance frequencies, the types of the atoms within the target may be determined by inspecting the spectrum of the magnetic resonance signal received via the reception RF coil.

Much research is being conducted on techniques of acquiring a high-definition, high-quality magnetic resonance image. A technique capable of providing a uniform magnetic field and acquiring a fast, stable, and high-quality image by constructing a transmission RF coil with multiple channels and applying an independent RF signal to each channel is an example of one type of this research. A system that uses a multi-channel RF coil system for transmission due to non-uniformity of a magnetic field occurring within a human body due to a dielectric effect is already commonly used in high magnetic field MRI apparatuses employing a magnetic field strength of 3 Tesla (T) or greater.

Such a multi-channel RF coil needs to be designed to effectively contribute to magnetic field uniformization, called B1 shimming, and to reduce an amount of energy of an electric field that is absorbed by a human body. The amount of energy of the electric field that is absorbed by a human body may be expressed by a specific absorption rate (SAR), which is a rate at which energy is absorbed per mass of tissue. A maximum permissible SAR is strictly regulated by the U.S. Food and Drug Administration (FDA), the International Electrotechnical Commission (IEC), and other regulatory bodies, and this regulation is more strictly applied to medical equipment than to other electronic equipment.

Since a conventional multi-channel transmission radio frequency (RF) coil has a fixed rigid frame structure, a local peak SAR occurs where an RF coil is close to a human body, and cannot be completely removed by B1 shimming. Moreover, if some elements of the RF coil are not used to reduce the local peak SAR, the degree of freedom during B1 shimming is degraded, and thus an expected performance improvement in B1 shimming may not be obtained.

SUMMARY

In one general aspect, a radio frequency (RF) coil device includes a plurality of RF coil elements configured to generate an RF magnetic field; and a support member configured to support the plurality of RF coil elements so that at least one of the plurality of RF coil elements is movable.

The support member may have a cylindrical shape and may be configured to be disposed on an inner surface of a cylindrical housing of a magnetic resonance imaging (MRI) apparatus; and the plurality of RF coil elements may be arranged along a circumference of the support member.

The support member may be further configured to support the plurality of RF coil elements so that the at least one of the plurality of RF coil elements is movable along the circumference of the support member to adjust spacings on the circumference between the at least one of the plurality of RF coil elements and other ones of the plurality of RF coil elements that neighbor the at least one of the plurality of RF coil elements.

The support member may be further configured to support the plurality of RF coil elements so that the at least one of the plurality of RF coil elements is detachable from the support member.

Each of the plurality of RF coil elements may include a conductor extending in a length direction of the cylindrical housing.

Each of the at least one of the plurality of RF coil elements may include a plurality of sub-elements arranged in a length direction of the cylindrical housing; and the support member may be further configured to support the plurality of sub-elements so that at least one of the plurality of sub-elements of each of the at least one of the plurality of RF coil elements is movable in the length direction.

The support member may have a cylindrical or semicylindrical shape configured to surround a part of a target; and the plurality of RF coil elements may be arranged along a circumference of the support member.

The support member may be further configured to support the plurality of RF coil elements so that the at least one of the plurality of RF coil elements is movable along the circumference of the support member to adjust spacings on the circumference between the at least one of the plurality of RF coil elements and other ones of the plurality of RF coil elements that neighbor the at least one of the plurality of RF coil elements.

The support member may include a plurality of support blocks configured to support respective ones of the plurality of RF coil elements; and the plurality of support blocks may be connected together to form a two-dimensional surface configured to cover a part of a target.

At least one of the plurality of support blocks may be connected to at another one of the plurality of support blocks so that a spacing between the at least one of the plurality of support blocks and the other one of the plurality of support blocks on the two-dimensional surface of the support member is adjustable.

At least one of the plurality of support blocks may be connected to another one of the plurality of support blocks so that a distance between the at least one of the plurality of support blocks and the target is adjustable.

The plurality of RF coil elements may be further configured to be independently operable in a multi-channel coil mode.

The RF coil device may further include a driver and controller configured to drive and control the plurality of RF coil elements; and the driver and controller may be further configured to independently control a magnitude and a phase of power input to the plurality of RF coil based on positions of the plurality of RF coil elements relative to one another.

The RF coil device may further include a probe configured to measure a strength of an RF magnetic field generated by the plurality of RF coil elements; and the driver and controller may be further configured to predict a specific absorption rate (SAR) of a target based on the strength of the RF magnetic field measured by the probe.

In another general aspect, a magnetic resonance apparatus includes a main magnet; and a radio frequency (RF) coil device; and the RF coil device includes a plurality of RF coil elements configured to generate an RF magnetic field; and a support member configured to support the plurality of RF coil elements so that at least one of the plurality of RF coil elements is movable.

The magnetic resonance apparatus may be an magnetic resonance imaging apparatus or a magnetic resonance spectroscopy apparatus.

In another general aspect, a method of driving and controlling a radio frequency (RF) coil device, the RF coil device including a plurality of RF coil elements configured to generate an RF magnetic field, and a driver and controller configured to drive and control the plurality of RF coil elements, the method including predicting a specific absorption rate (SAR) of a target with the plurality of RF coil elements positioned at basic positions; and adjusting a position of at least one of the plurality of RF coil elements in response to the predicted SAR being higher than a maximum permissible SAR.

The method may further include predicting an SAR of the target with the at least one of the plurality of RF coil elements at the adjusted position.

The adjusting of a position of the at least one of the plurality of RF coil elements may include adjusting a distance between the at least one of the plurality of RF coil elements and the target.

The adjusting of a position of the at least one of the plurality of RF coil elements may include adjusting a spacing between the at least one of the plurality of RF coil elements and at least one other one of the plurality of RF coil elements that neighbors the at least one of the plurality of RF coil elements.

In another general aspect, a radio frequency (RF) coil device includes a plurality of RF coil elements configured to have a changeable configuration and generate an RF magnetic field.

At least one of the plurality of RF coil elements may be configured to be movable to change the configuration of the plurality of RF coil elements.

At least one of the plurality of RF coil elements may be configured to be detachable from the RF coil device to change the configuration of the plurality of RF coil elements.

The changeable configuration of the plurality of RF coil elements may enable a specific absorption rate (SAR) of a target produced by the RF magnetic field generated by the plurality of coil elements to be adjusted by changing the configuration of the plurality of RF coil elements.

Other features and aspects will be apparent from the following detailed description, the drawings, and the claims.

DETAILED DESCRIPTION

Figure 1:
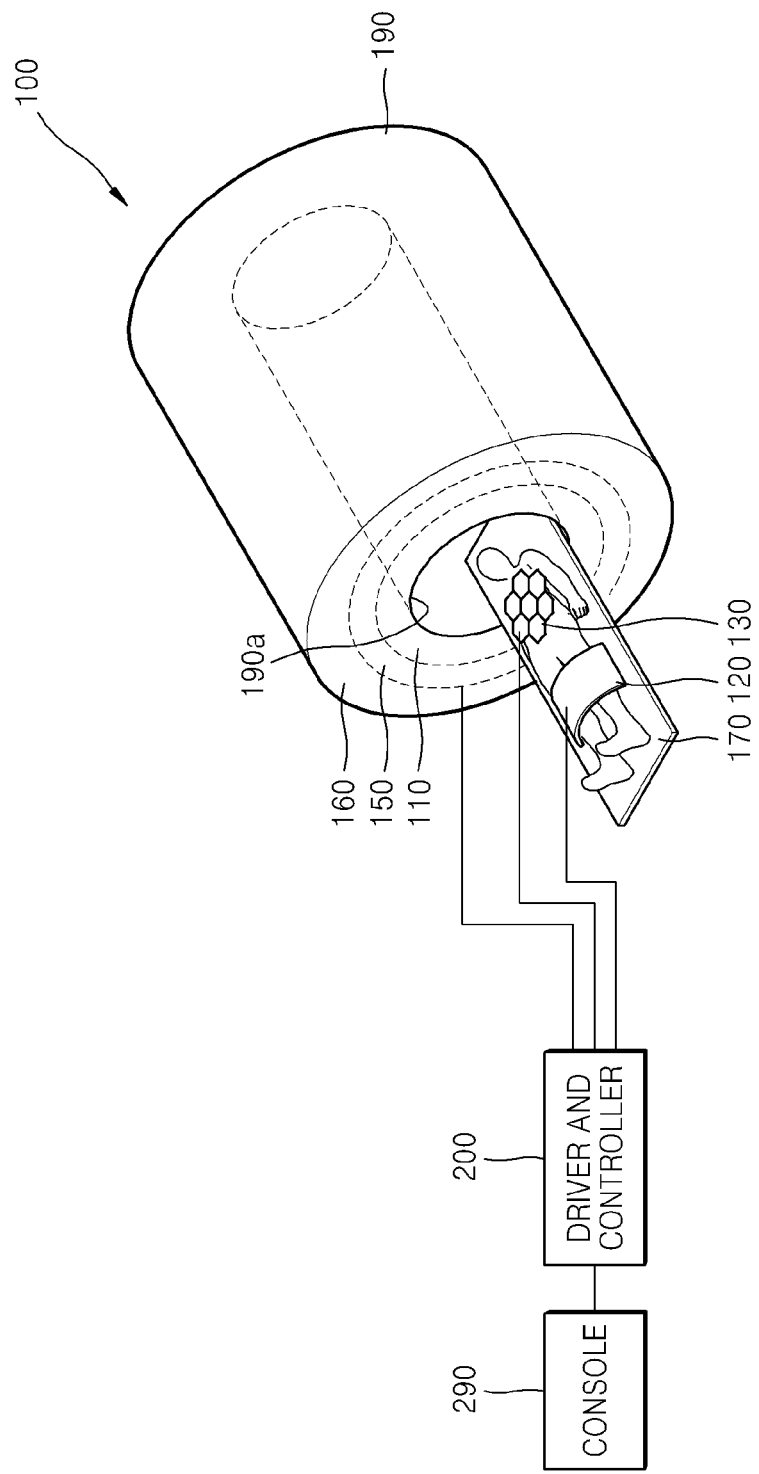
FIG. 1 is a schematic view of an example of a magnetic resonance imaging (MRI) apparatus.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, description of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

FIG. 1 is a schematic view of an example of a magnetic resonance imaging (MRI) apparatus. Referring to FIG. 1, the MRI apparatus includes a cylindrical magnetic structure 100, which includes a volume radio frequency (RF) coil device 110, a gradient coil 150, and a main magnet 160 sequentially arranged from the inside of a cylindrical housing 190 to the outside thereof. A target, namely, an inspection target, lies on a table 170 and is moved into a bore 190a of the cylindrical housing 190, and then an MRI scan is performed.

The MRI apparatus further includes a driver and controller 200 that drives and controls the volume RF coil device 110, the gradient coil 150, and the main magnet 160 of the cylindrical magnetic structure 100, and a console 290 that displays a magnetic resonance image or receives a user input for manipulating the MRI apparatus. The MRI apparatus may further include a local RF coil device 120 or a surface RF coil device 130 in addition to the volume RF coil device 110. In this case, the driver and controller 200 also drives and controls the local RF coil device 120 or the surface RF coil device 130.

The main magnet 160 generates a main magnetic field for magnetizing atomic nuclei of elements that exhibit a magnetic resonance phenomenon, such as hydrogen, phosphorus, and sodium, among the elements distributed in a human body. The main magnet 160 may be a superconductive electromagnet or a permanent magnet.

The gradient coil 150 generates a spatially linear magnetic gradient field to capture a magnetic resonance image. In general, three gradient coils that form magnetic gradient fields in x-, y-, and z-directions, respectively, are used to capture a magnetic resonance image. In order for a magnetic resonance image signal to be expressed in a spatial frequency region, that is, a k-region, the gradient coil 150 spatially controls a rotating frequency or phase of a magnetization vector when the magnetization vector rotates in a horizontal plane.

A magnetization vector needs to lie in a horizontal plane to produce a magnetic resonance image signal. To this end, the RF coil devices 110, 120, and 130, which generate RF magnetic fields each having a Larmor frequency as a center frequency, are provided. When an RF current in a Larmor frequency band is applied to the RF coil devices 110, 120, and 130, rotating magnetic fields that rotate at a Larmor frequency are generated in the RF coil devices 110, 120, and 130. The rotating magnetic field causes resonance of a magnetization vector, that is, nuclear magnetic resonance, so that the magnetization vector lies in a horizontal plane. Once a magnetization vector lies in a horizontal plane, the magnetization vector rotates at a Larmor frequency in the horizontal plane and generates an electromotive force in a reception RF coil according to Faraday's Law. When the electromotive force, that is, a received RF signal, is amplified by an RF amplifier and then demodulated into a sine wave having the Larmor frequency, a magnetic resonance signal in a base band may be obtained. The magnetic resonance signal in a base band is quantized, output to a computer, and processed by the computer to obtain a magnetic resonance image.

Figure 2:
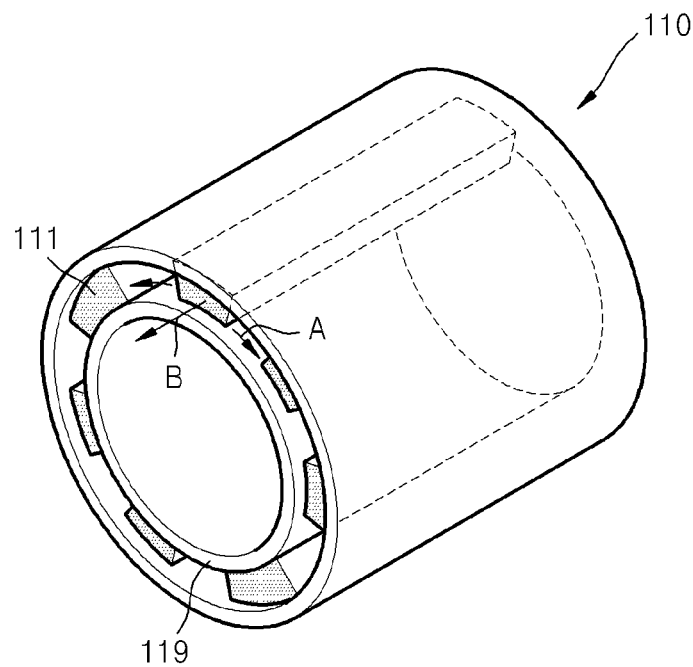
FIG. 2 is a perspective view of an example of a volume radio frequency (RF) coil device of the MRI apparatus of FIG. 1.

FIG. 2 is a perspective view of an example of the volume RF coil device 110 of the MRI apparatus of FIG. 1. Referring to FIG. 2, the volume RF coil device 110 includes a plurality of RF coil elements 111 mounted on a cylindrical frame 119. The cylindrical frame 119 may be a resin mold structure, for example.

Each of the RF coil elements 111 extends along the length of the cylindrical frame 119. The RF coil elements 111 are arranged along the circumference of the cylindrical frame 119. All or some of the RF coil elements 111 are installed on the cylindrical frame 119 so that they can individually move in a circumferential direction A of the cylindrical frame 119. Furthermore, at least some of the RF coil elements 111 are installed on the cylindrical frame 119 so that they can move in a length direction B of the cylindrical frame 119. Also, at least some of the RF coil elements 111 may be installed on the cylindrical frame 119 so that they can be detached from the cylindrical frame 119.

The volume RF coil device 110 may further include an electrical or physical driving device (not shown) for moving the RF coil elements 111. The electrical or physical driving device maybe any device known to one of ordinary skill in the art that is capable of electrically or physically moving another device. For example, the RF coil elements 111 may be electrically moved by a driving motor or a piezoelectric actuator, or may be physically moved by hand or a mechanical actuator.

Figure 3:
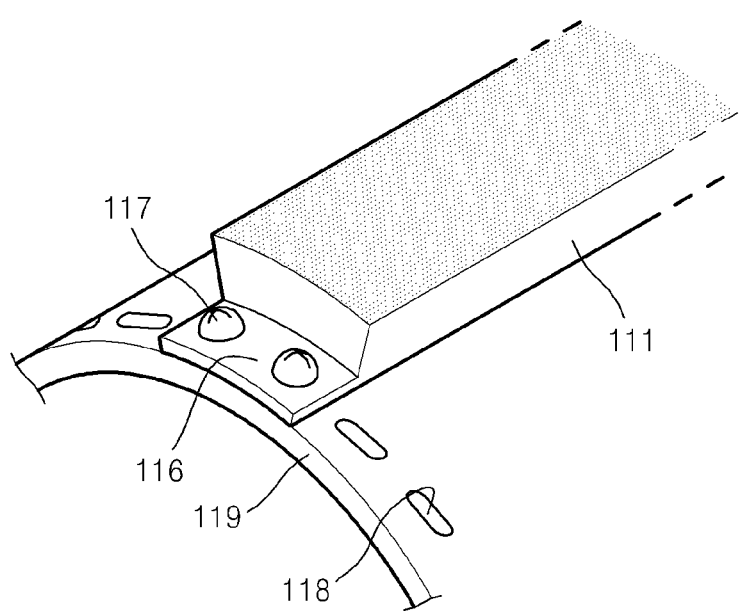
FIG. 3 illustrates an example of a locking unit of the volume RF coil device of FIG. 2.

FIG. 3 illustrates an example of a locking unit 116 of the volume RF coil device 110 of FIG. 2. Referring to FIG. 3, the locking unit 116 is provided on one end of a body of each RF coil element 111 and may be installed on the cylindrical frame by locking members, such as bolts 117. A plurality of locking holes 118 may be formed in a portion of the cylindrical frame 119 that contacts the locking unit 116 of the RF coil element 111 so that the RF coil element 111 may be installed on the cylindrical frame 119 by the bolts 117. The locking holes 118 may be formed along the circumference of the cylindrical frame 119 so that the RF coil elements 111 may be installed at arbitrary locations on the circumference of the cylindrical frame 119. Each of the locking holes 118 extends along the circumference of the cylindrical frame 119 so that the location of the RF coil element 111 may be finely adjusted. Although FIG. 1 shows the locking unit 116 being provided on one end of the body of each RF coil element 111, the locking unit 116 may be provided on both ends of the body of each RF coil element.

The locking unit 116 and the bolts 117 are only one example, and the RF coil element 111 is not limited thereto. For example, the RF coil element 111 may be installed at an arbitrary location on the circumference of the cylindrical frame 119 by any other locking member known to one of ordinary skill in the art.

Figure 4A:
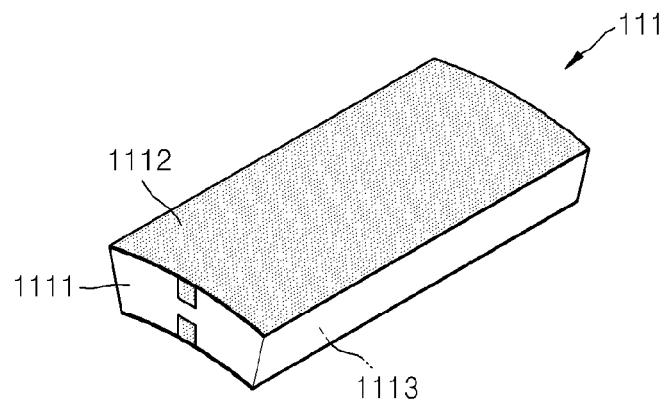
FIGS. 4A through 4C illustrate various examples of an RF coil element of the volume RF coil device of FIG. 2.
Figure 4B:
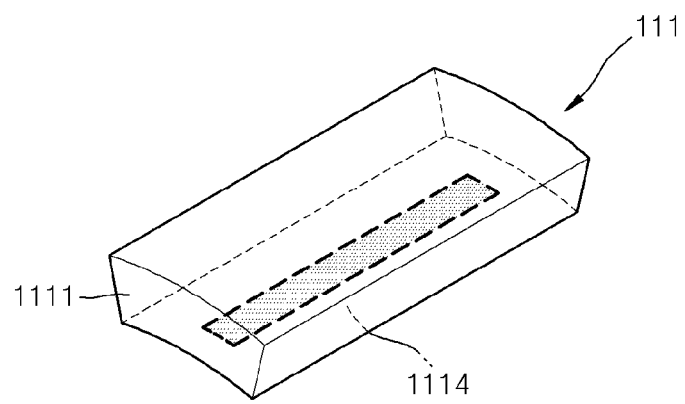
Figure 4C:
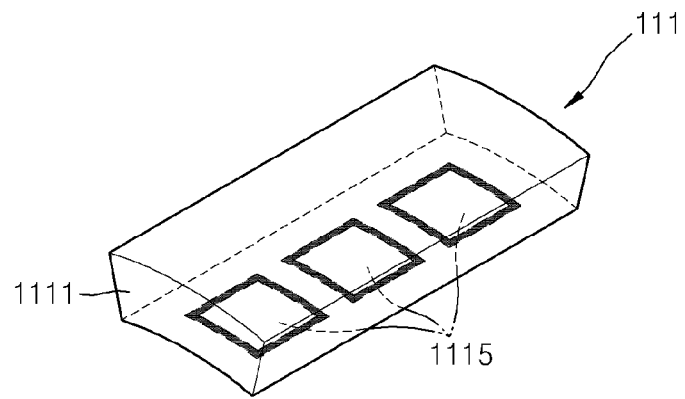

FIGS. 4A through 4C illustrate various examples of the RF coil element 111 of the volume RF coil device 110 of FIG. 2. For example, referring to FIG. 4A, the RF coil element 111 may be a transverse electromagnetic (TEM) RF coil element 111 including striplines 1112 and 1113 formed on an inner surface and an outer surface, respectively, of a body 1111. As another example, referring to FIG. 4B, the RF coil element 111 may be a micro-stripline RF coil element 111 including a micro-stripline 1114 formed inside the body 1111 or on the inner or outer surface of the body 1111. As still another example, referring to FIG. 4C, the RF coil element 111 may be a loop array RF coil element 111 including a plurality of loop coils 1115 arranged along the length of the RF coil element 111. The striplines 1112 and 1113, the micro-stripline 1114, and the loop coils 1115 are formed of a conductor. The RF coil element 111 includes the conductor (see FIGS. 4A through 4C), to which an RF electrical signal is input, and the body 1111, which supports the conductor.

The RF coil elements 111 of FIGS. 4A-4C are only examples, and the RF coil element 111 is not limited thereto. For example, each RF coil element 111 may be an RF coil element 111 in which individual channels of any multi-channel RF coil known to one of ordinary skill in the art may be mechanically independently divided and installed at arbitrary locations on the circumference of the cylindrical frame 119.

Referring back to FIG. 2, ports (not shown) via which RF signals are received are provided on ends of the RF coil elements 111. A decoupling circuit or structure (not shown) that blocks magnetic coupling, such as a capacitor, may be provided so that each RF coil element 111 operates independently of other neighboring RF coil elements. Alternatively, the RF coil elements 111 may be insulated from one another.

The RF coil elements 111 may be operated in a multi-channel mode in which RF signals are independently received by the RF coil elements from the driver and controller 200. For example, the RF coil elements 111 may be wired in a parallel circuit, and magnitudes and phases of RF signals received by each of the RF coil elements 111 may be independently controlled by the driver and controller 200.

Also, the RF coil elements 111 may be grouped into groups of RF coil elements 111, and individual RF signals may be independently input from driver and controller 200 to the individual groups so that all of the RF coil elements 111 of a particular group receive the same RF signal, and RF coil elements 111 of different groups receive different RF signals.

When the RF coil elements 111 are arranged at basic positions at which the RF coil elements are arranged equidistantly on the circumference of the cylindrical frame 119, and an inspection target is positioned inside the volume RF coil device 110, arms or other parts of the inspection target may be located closer to the inner surface of the volume RF coil device 110 than the other body parts. Therefore, when the volume RF coil device 110 transmits electromagnetic waves to make a magnetization vector resonate, B1 shimming is required to obtain a uniform RF magnetic field because a distance between the inner surface of the volume RF coil device 110 and the inspection target varies depending on body parts or postures of the inspection target. In addition, since a body part of the inspection target that is relatively close to the inner surface of the volume RF coil device 110 may be exposed to electromagnetic waves producing a high local peak SAR, this exposure needs to be prevented. A high local peak SAR may be a local peak SAR that exceeds a maximum permissible SAR, such as a maximum permissible SAR specified by a regulatory body, such as the U.S. Food and Drug Administration (FDA) or the International Electrotechnical Commission (IEC).

Since the volume RF coil device 110 enables the RF coil elements 111 to be individually moved in the circumferential direction A of the cylindrical frame 119, spacings between the RF coil elements 111 on the circumference of the cylindrical frame 119 may be adjusted so that B1 shimming is performed without reducing the number of channels available for the volume RF coil device 110, and so that exposure of a specific body part of the inspection target to electromagnetic waves producing a high local peak SAR is prevented.

Figure 5:
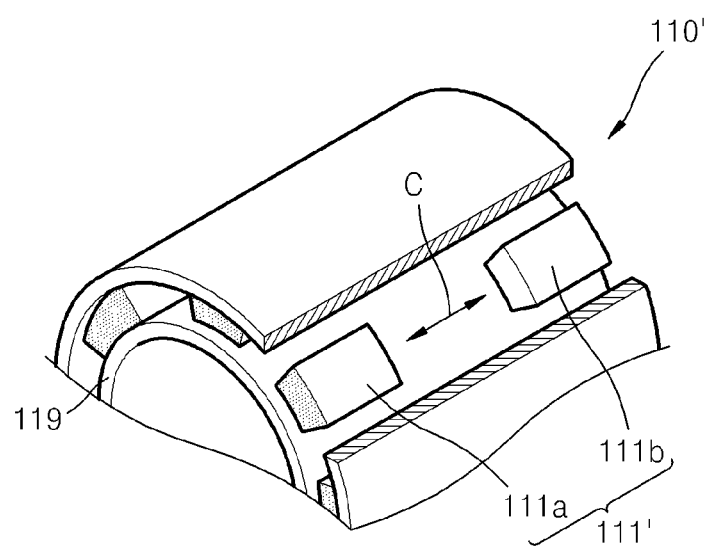
FIG. 5 is a perspective view of an example of another volume RF coil device of the MRI apparatus of FIG. 1.

FIG. 5 is a perspective view of an example of another volume RF coil device 110' of the MRI apparatus of FIG. 1. Referring to FIG. 5, the volume RF coil device 110' includes a plurality of RF coil elements 111' that are installed on the cylindrical frame 119 and are each divided into a plurality of sub-elements 111a and 111b arranged in a length direction C of the cylindrical frame 119. The sub-elements 111a and 111b may independently move in the length direction C of the cylindrical frame 119. The sub-elements 111a and 111b of each of the RF coil elements 111' may be electrically connected to each other via a simple lead wire, or may be connected to each other with a capacitor for resonant frequency adjustment interposed therebetween. The volume RF coil device 110' may further include an electrical or physical driving device (not shown) for independently moving the sub-elements 111a and 111b of each of the RF coil elements 111' in the length direction C of the cylindrical frame 119. The electrical or physical driving device may be any device known to one of ordinary skill in the art that is capable of electrically or physically moving another device. For example, the sub-elements 111a and 111b may be electrically moved by a driving motor or a piezoelectric actuator, or may be physically moved by hand or a mechanical actuator.

As described above with reference to FIGS. 2 and 3, the RF coil elements 111' may be installed on the cylindrical frame 119 so that they can individually move in the circumferential direction A of the cylindrical frame 119. Also, at least some of the RF coil elements 111' may be installed on the cylindrical frame 119 so that they can be detached from the cylindrical frame 119.

The sub-elements 111a and 111b of each of the RF coil elements 111' may be TEM RF coil elements, micro-stripline RF coil elements, or loop array RF coil elements as described above with reference to FIGS. 4A-4C. Alternatively, the sub-elements 111a and 111b of each of the RF coil elements 111' may be RF coil elements in which individual channels of any multi-channel RF coil known to one of ordinary skill in the art are mechanically independently divided.

Since the volume RF coil device 110' is installed so that the sub-elements 111a and 111b of each of the RF coil elements 111' may individually move in the length direction C of the cylindrical frame 119, a spacing between the sub-elements 111a and 111b may be suitably adjusted so that B1 shimming may be performed without reducing the number of channels available for the volume RF coil device 110', and so that exposure of a specific body part of the inspection target to electromagnetic waves producing a high local peak SAR may prevented.

The volume RF coil devices 110 and 110' described above with reference to FIGS. 2-5 may be transmission-only coils that receive RF signals to generate RF magnetic fields. Alternatively, the volume RF coil devices 110 and 110' may be transceiver coils that not only receive RF signals to generate RF magnetic fields, but also detect magnetic resonance signals generated from a target.

Although the volume RF coil devices 110 and 110' are installed on the inner side of the cylindrical magnetic structure 100 of the MRI apparatus in FIGS. 2-5, the volume RF coil devices 110 and 110' are not limited to this location, but may be installed at any other location in the cylindrical magnetic structure 100. The structures of the volume RF coil devices 110 and 110' may be equally applied to the local RF coil device 120 of FIG. 1, which is used to obtain a magnetic resonance image of a specific part of the target (for example, the head, arms, legs, and other parts of the inspection target). In other words, the cylindrical exteriors of the volume RF coil devices 110 and 110' may be transformed into a semi-cylindrical shape or any other shape suitable for a specific part of the target and may be used as the local RF coil device 120 of FIG. 1.

Figure 6:
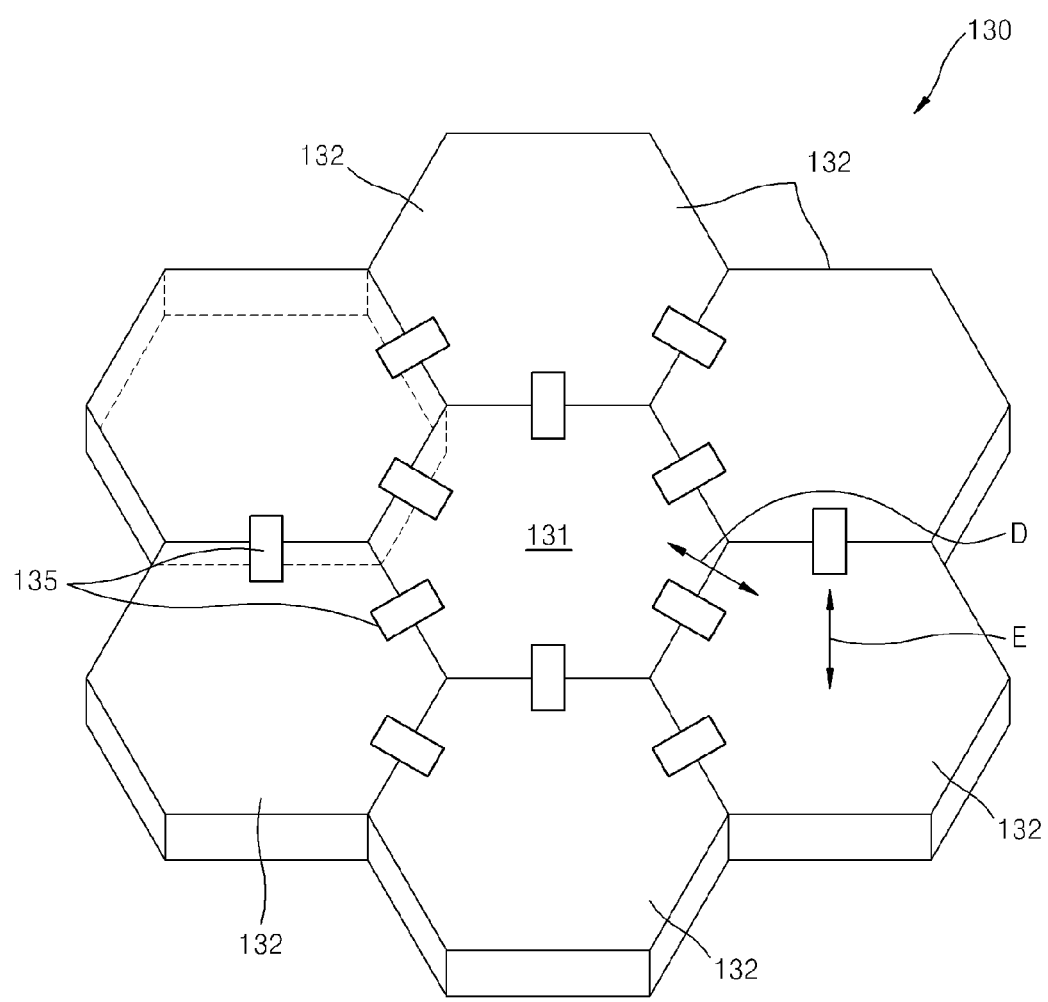
FIG. 6 is a perspective view of an example of a surface RF coil device of the MRI apparatus of FIG. 1.

FIG. 6 is a perspective view of an example of the surface RF coil device 130 of the MRI apparatus of FIG. 1. Referring to FIG. 6, the surface RF coil device 130 includes a plurality of RF coil elements 131 and 132 arranged on a two-dimensional surface. The surface RF coil device 130 is placed on an exterior of the target, and therefore the two-dimensional surface on which the plurality of RF coil elements 131 and 132 are arranged may be curved or flat.

The RF coil elements 131 and 132 may each include conductors (not shown), and bodies 1311 and 1321 (see FIG. 7) formed in hexagonal tile shapes that surround the conductors of the RF coil elements 131 and 132. The bodies 1311 and 1321 may be resin mold structures. The bodies 1311 and 1321 may be considered to be support blocks for respective ones of the RF coil elements 131 and 132, and may be considered to form a support member for the RF coil elements 131 and 132. The conductors, which generate RF magnetic fields, may be provided on bottom sides 1312 and 1322 (see FIG. 7) of the bodies 1311 and 1321 or near the bottom sides 1312 and 1322. Shielding members for shielding electromagnetic waves may be provided on top sides 1313 and 1323 (see FIG. 7) of the bodies 1311 and 1321 of the RF coil elements 131 and 132. A port (not shown) via which an RF signal is received may be provided on each of the RF coil elements 131 and 132. The shape of a conductor provided in each of the RF coil elements 131 and 132 may be substantially the same as the shape of a conductor of an individual RF coil element of a parallel transmission array in any surface multi-channel RF coil device that is known to one of ordinary skill in the art.

A decoupling circuit or structure (not shown), such as a capacitor that blocks magnetic coupling, may be provided so that the RF coil elements 131 and 132 operate independently from other neighboring RF coil elements. Alternatively, the RF coil elements 131 and 132 may be insulated from one another.

The RF coil elements 131 and 132 may be operated in a multi-channel mode in which RF signals are independently received by the RF coil elements 131 and 132 from the driver and controller 200 of FIG. 1. For example, the RF coil elements 131 and 132 may be wired in a parallel circuit, and magnitudes and phases of the RF signals received by each of the RF coil elements 131 and 132 may be independently controlled by the driver and controller 200.

Also, the RF coil elements 131 and 132 may be grouped into groups of RF coil elements, and individual RF signals may be independently input from the driver and controller 200 to the individual groups so that all of the RF coil elements of a particular group receive the same RF signal, and RF coil elements of different groups receive different RF signals.

For example, as illustrated in FIG. 6, the surface RF coil device 130 may be a 7-channel parallel transmission array with a central RF coil element 131 and 6 peripheral RF coil elements 132 surrounding the central RF coil element 131. However, RF coil elements may be added to or removed from the surface RF coil device 130 so that the surface RF coil device 130 may be driven with 5 channels, 11 channels, or any other number of channels.

Although the RF coil elements 131 and 132 of the surface RF coil device 130 each have a hexagonal tile shape in the example in FIG. 6, the shape of the RF coil elements 131 and 132 is not limited to the hexagonal tile shape. For example, the RF coil elements 131 and 132 may each have any of various shapes such as a triangle, a rectangle, and a pentagon, and RF coil elements having different shapes may constitute the surface RF coil device 130.

The RF coil elements 131 and 132 may be coupled to one another by locking units 135 enabling the positions of the RF coil elements 131 and 132 to be adjusted. For example, the locking units 135 may enable the RF coil elements 131 and 132 to be moved in a direction D (see FIG. 7) to adjust spacings between the RF coil elements 131 and 132, and may enable the RF coil elements 131 and 132 to be moved in a direction E (see FIG. 7) to adjust distances between the RF coil elements 131 and 132 and the target. Although FIG. 6 shows that all of the RF coil elements 131 and 132 are coupled to one another by the locking units 135, only some of the RF coil elements 131 and 132 may be coupled to one another by the locking elements 135.

The surface RF coil device 130 is a device that is placed on a specific part of the target, namely, the inspection target, and transmits an RF signal. Since the surface RF coil device 130 is disposed adjacent to a specific part of the inspection target, the surface RF coil device 130 is suitable for local region-of-interest (ROI) analysis, and is also suitable for forming a uniform RF magnetic field (i.e., a B1 field). However, since the RF coil elements 131 and 132 of the surface RF coil device 130 may be at different distances from the inspection target, the surface RF coil device 130 may also require B1 shimming to obtain a uniform RF magnetic field. In addition, since a body part of the inspection target that is relatively close to the bottom surface of the surface RF coil device 130 may be exposed to electromagnetic waves producing a high local peak SAR, this exposure needs to be prevented.

Since the surface RF coil device 130 in FIG. 6 enables the RF coil elements 131 and 132 to be moved in the direction D to adjust spacings between the RF coil elements 131 and 132, and to be moved in the direction E, namely, a vertical direction E, to adjust distances between the RF coil elements 131 and 132 and the inspection target, the positions of the RF coil elements 131 and 132 may be suitably adjusted so that B1 shimming may be performed without reducing the number of channels available for the surface RF coil device 130, and so that a specific body part of the inspection target is prevented from being exposed to electromagnetic waves producing a high local peak SAR.

Figure 7:
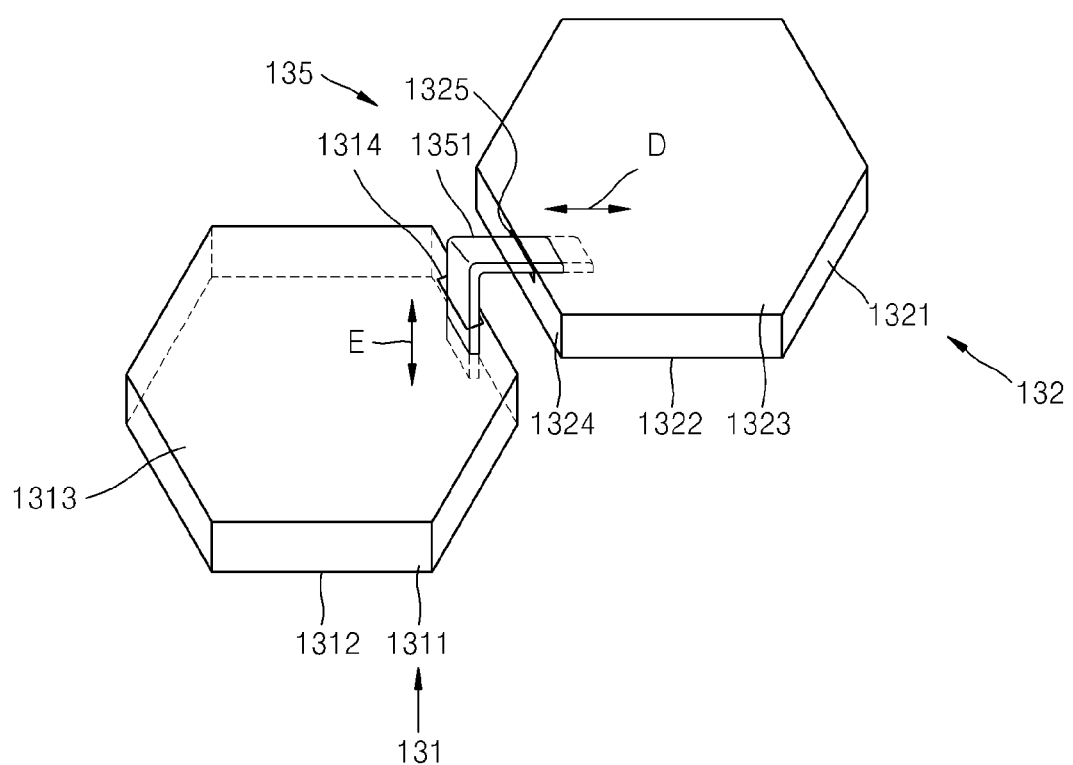
FIG. 7 illustrates an example of a locking unit of the surface RF coil device of FIG. 6.

FIG. 7 illustrates an example of the locking unit 135 of the surface RF coil device 130 of FIG. 6. Referring to FIG. 7, a rectangular groove 1314 may be formed near an edge of the top side 1313 of the body 1311 of the central RF coil element 131, and a rectangular groove 1325 may be formed on one lateral side 1324 of the body 1321 of the peripheral RF coil element 132. A locking member 1351 is inserted into the grooves 1314 and 1325 to couple the central RF coil element 131 to the peripheral RF coil element 132.

The locking member 1351 may have a structure in which a rectangular flat plate is bent at a right angle. The structure of the locking unit 135 of FIG. 7 enables the peripheral RF coil element 132 to be moved in the vertical direction E and the direction D, namely, a surface direction D, relative to the central RF coil element 131. Consequently, a spacing between the central RF coil element 131 and the peripheral RF coil element 132 and a spacing between the RF coil element 131 or 132 and the two-dimensional surface on which the plurality of RF coil elements 131 and 132 are arranged may be arbitrarily adjusted.

Locations of the grooves 1314 and 1325 may be switched with each other between the RF coil elements 131 and 132. That is, the groove 1314 may be formed on one lateral side of the body 1311 of the central RF coil element 131, and the groove 1325 may be formed near an edge of the top side 1323 of the body 1321 of the peripheral RF coil element 132.

The sizes and shapes of the grooves 1314 and 1325 may be almost the same as the sizes and shapes of the cross-sections of both ends of the locking member 1351, and the locking member 1351 may fix the central RF coil element 131 and the peripheral RF coil element 132 to each other by a frictional force between the grooves 1314 and 1325 and the locking member 1351. Alternatively, a special fixing member (for example, a bolt, a wedge, a permanent magnet, or any other fixing member known to one of ordinary skill in the art) (not shown) may apply a locking force between the locking member 1351 and the grooves 1314 and 1325, or between the locking member 1351 and the RF coil elements 131 and 132.

The locking unit 135 of FIG. 7 is only an example, and the surface RF coil device 130 is not limited to the locking unit 135. The RF coil elements 131 and 132 may be coupled to each other by any locking unit known to one of ordinary skill in the art that enables positions of the RF coil elements 131 and 132 to be adjusted.

Figure 8:
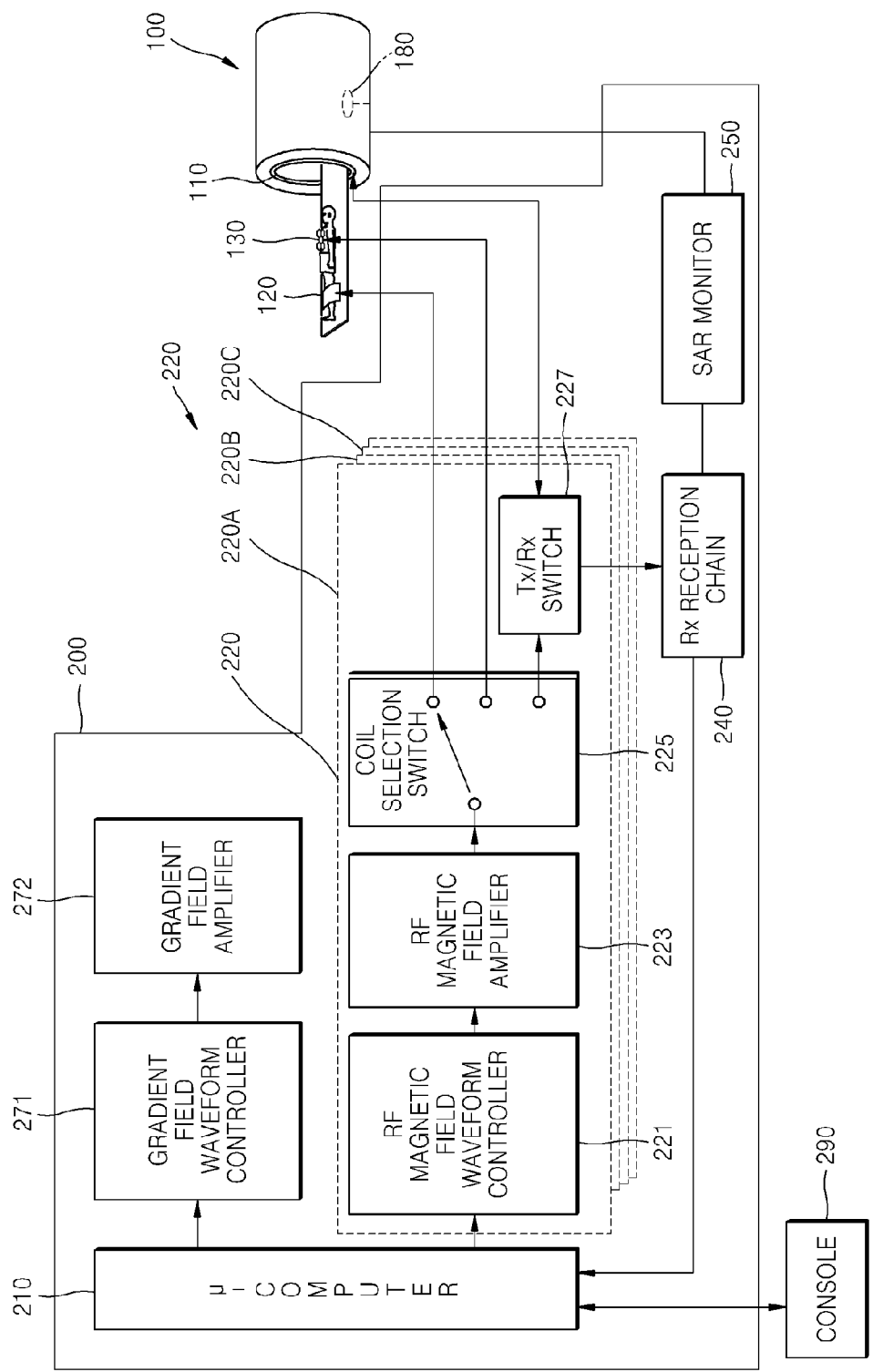
FIG. 8 is a block diagram of an example of a driver and controller of the MRI apparatus of FIG. 1.

FIG. 8 is a block diagram of an example of the driver and controller 200 of the MRI apparatus of FIG. 1. Referring to FIG. 8, the driver and controller 200 includes an RF transmission circuit 220 and an Rx reception chain 240 controlled by a p-computer 210. The driver and controller 200 may display a magnetic resonance image or various pieces of information to a user via the console 290, and may receive various control commands via the console 290.

The RF transmission circuit 220 includes an RF magnetic field waveform controller 221 that controls the pulse width, amplitude, phase, and other parameters of an RF signal to form an RF signal having a suitable waveform, an RF magnetic field amplifier 223 that amplifies an RF signal current, and a coil selection switch 225 that selects one of the RF coil devices 110, 120, and 130. The RF magnetic field waveform controller 221 produces an RF magnetic field signal having a suitable waveform according to B1 shimming or position movements of the RF coil elements 111, 131, and 132.

When the RF coil devices 110, 120, and 130 are transceiver coils, a Tx/Rx switch 227 is provided between the coil selection switch 225 and the RF coil devices 110, 120, and 130. As illustrated in FIG. 8, when the volume RF coil device 110 is a transceiver coil, the Tx/Rx switch 227 may separate an RF signal transmitted to the volume RF coil device 110 from an RF signal received from the volume RF coil device 110.

The Rx reception chain 240 may include an RF amplifier, a filter, a demodulator, and an analog-to-digital converter (ADC) (not shown), and processes RF signals received from the RF coil devices 110, 120, and 130. For example, a received RF signal may be amplified by the RF amplifier and then demodulated into a sinusoidal wave having a Larmor frequency to generate a magnetic resonance signal in a base band, and the magnetic resonance signal in a base band may be quantized and output to the p-computer 210. The p-computer 210 processes the magnetic resonance signal received from the Rx reception chain 240 to thus obtain a magnetic resonance image. In the example in FIG. 8, the Rx reception chain 240 receives an RF signal from only the volume RF coil device 110.

The RF transmission circuit 220 may include a plurality of parallel RF transmission circuits 220A, 220B, 220C, . . . to apply independent RF signals for individual channels to the RF coil devices 110, 120, and 130 if the RF coil devices 110, 120, and 130 are operated in a multi-channel mode. The parallel RF transmission circuits 220A, 220B, 220C, . . . may correspond to the channels of the RF coil devices 110, 120, and 130 in a one-to-one correspondence or a one-to-multi correspondence.

A probe 180 for sampling only may be further included in the RF coil devices 110, 120, and 130 to measure an RF magnetic field (i.e., a B1 field) generated in the RF coil devices 110, 120, and 130 to perform SAR monitoring. The Rx reception chain 240 may provide a mode for processing a signal corresponding to the RF magnetic field (i.e., a B1 field) measured by the probe 180. In this case, the signal corresponding to the RF magnetic field detected by the probe 180, namely, an RF magnetic field signal, may be input to the driver and controller 200 via an SAR monitor 250 and the Rx reception chain 240 to thereby determine whether the inspection target is exposed to electromagnetic waves producing a high local peak SAR. The probe 180 is optional. If the probe 180 is not provided, the Rx reception chain 240 may provide a mode that uses signals received from the RF coil devices 110, 120, and 130 to measure the RF magnetic field (i.e., a B1 field).

In addition to the above-described circuits for driving and controlling the RF coil devices 110, 120, and 130, the driver and controller 200 further includes a gradient field waveform controller 271 that forms a magnetic gradient field signal input to the gradient coil 150 of FIG. 1 to form magnetic gradient fields in x-, y-, and z-directions within the bore 190a of the MRI apparatus of FIG. 1, and a gradient field amplifier 272 that amplifies the magnetic gradient field signal formed by the gradient field waveform controller 271.

Figure 9:
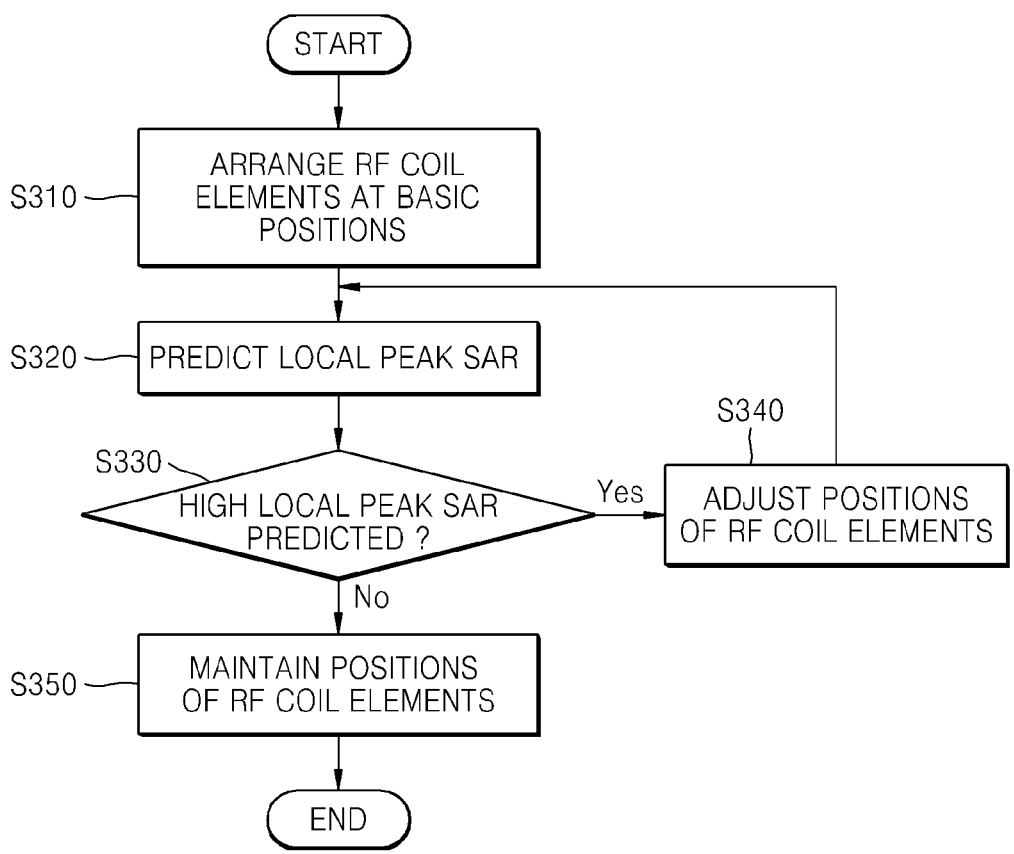
FIG. 9 is a flowchart of an example of a method of operating any of the RF coil devices of the MRI apparatus of FIG. 1.

FIG. 9 is a flowchart of an example of a method of operating any of the RF coil devices of the MRI apparatus of FIG. 1. For convenience of explanation, the following explanation will focus on the volume RF coil device 110 of FIG. 1. Referring to FIG. 9, to obtain a magnetic resonance image of a target, namely, an inspection target, when the inspection target is moved into the bore 190a of the cylindrical housing 190, an MRI scan process starts.

First, the RF coil elements 111 of the volume RF coil device 110 are arranged at basic positions in operation S310.

In operation S320, it is determined whether a situation occurs where the danger that the inspection target is exposed to electromagnetic waves producing a high local peak SAR is predicted with the RF coil elements 111 of the volume RF coil device 110 arranged at the basic positions. For example, if the inspection target has a big body, then the shoulder, arms, or other parts of the inspection target may be too close to the inner circumference of the volume RF coil device 110, and thus a high local peak SAR may be predicted. Also, if the inspection target changes his or her posture, a portion of the inner circumference of the volume RF coil device 110 to which the shoulder, arms, or the other parts of the inspection target are close changes, and thus the RF coil elements 111 primarily contributing to occurrence of a high local peak SAR change.

Alternatively, the determination in operation S320 as to whether a situation occurs where the danger that the inspection target is exposed to electromagnetic waves producing a high local peak SAR is predicted may be made by combining amplitude information, phase information, and other parameters of an electromagnetic field that are output by each channel of the volume RF coil device 110 as a result of B1 shimming. The basic positions of the RF coil elements 111 may be, for example, positions at which the RF coil elements 111 are arranged equidistantly on the circumference of the cylindrical frame 119. For example, the high local peak SAR may be predicted using an algorithm for performing local or global B1 shimming by changing the amplitudes and phases of respective channel RF signals of the RF coil elements 111, and measuring the resulting RF magnetic field. To measure the RF magnetic field (i.e., a B1 field) of the MRI apparatus, the Rx reception chain 240 of FIG. 8 may provide a mode that uses the probe 180 for sampling only, or an RF coil capable of performing a reception function.

If a high local peak SAR is predicted as a result of the measurement of the RF magnetic field in operation S330, the positions of the RF coil elements 111 are adjusted in operation S340.

Then, the method returns to operation S320 to measure the RF magnetic field (i.e., a B1 field) of each channel again and to predict an SAR for the inspection target with the RF coil elements 111 of the volume RF coil device 110 arranged at the adjusted positions, and, if necessary, the positions of the RF coil elements 111 are adjusted again in operation S340. For example, if the shoulder of the inspection target is too close to the RF coil elements 111, a local peak SAR may be predicted from the shoulder of the inspection target. If it is determined in operation S330 that a high local peak SAR is predicted from the shoulder of the inspection target as described above, RF coil elements 111 close to the shoulder of the inspection target are spaced further apart on the circumference of the cylindrical frame 119 in operation S340 to ease the high local peak SAR at the shoulder of the inspection target. Alternatively, to ease the local peak SAR, power input to RF coil elements 111 near a body part (such as the shoulder) where a high local peak SAR is predicted may be blocked, or the RF coil elements 111 near the body part (such as the shoulder) may be removed. On the other hand, if it is determined that a high local peak SAR is not predicted in operation S330, the positions of the RF coil elements 111 are maintained in operation S350, and the MRI scan process is conducted.

The examples of an MRI apparatus described above overcome limitations of an image sequence by making full use of the advantages of the multi-channel volume RF coil device 110 due to a structure capable of independently operating the RF coil elements 111 and independently adjusting the positions of the RF coil elements 111, and by reducing a high local peak SAR.

The method of operating an RF coil device described above with respect to the volume RF coil device 110 is also applicable to the local RF coil device 120 and the surface RF coil device 130.

Although an MRI apparatus including all of the volume RF coil device 110, the local RF coil device 120, and the surface RF coil device 130 has been described above, the MRI apparatus may include only any one or two of the volume RF coil device 110, the local RF coil device 120, and the surface RF coil device 130.

Although the examples described above relate to an MRI apparatus, the examples are not limited to the MRI apparatus. As another example, since a magnetic resonance spectroscopy (MRS) apparatus uses an RF coil that is substantially the same as an MRI apparatus, the examples of an RF coil device described above may also be applied to an MRS apparatus.

An MRS apparatus analyzes physical, chemical, and biological features of a material using a magnetic resonance phenomenon. Such an MRS apparatus disposes a target within a high magnetic field, induces magnetic resonance by directing a pulse RF signal toward a target via a transmission RF coil, and detects a magnetic resonance signal for each frequency via a reception RF coil disposed near the target. Since different types of atoms within a target generate different magnetic resonance frequencies, the types of the atoms within the target may be determined by inspecting the frequency spectrum of a magnetic resonance signal. In such an MRS apparatus, a transmission RF coil for transmitting a pulse RF signal has a structure and a function that are substantially the same as the structure and the function of the RF coil device for an MRI apparatus described above. Thus, the RF coil devices 110, 120, and 130 described above may also be used in an MRS apparatus. For example, the transmission RF coil for an MRS apparatus may also be constructed with multiple channels including parallel transmission coil elements to form a uniform magnetic field. In this case, each of the parallel transmission coil elements may have a locking structure enabling the positions of the parallel transmission coil elements to be adjusted, like the RF coil elements described above.

The driver and controller 200, the RF transmission circuit 220, the parallel RF transmission circuits 220A, 220B, 220C, . . . , the RF magnetic field waveform controller 221, the Rx reception chain 240, the SAR monitor 250, the gradient field waveform controller 271, and the console 290 described above that perform the operations illustrated in FIG. 9 may be implemented using one or more hardware components, one or more software components, or a combination of one or more hardware components and one or more software components.

A hardware component may be, for example, a physical device that physically performs one or more operations, but is not limited thereto. Examples of hardware components include resistors, capacitors, inductors, power supplies, frequency generators, operational amplifiers, power amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the detailed description.

What is claimed is:
1. A radio frequency (RF) coil device, comprising:
a plurality of RF coil elements configured to generate an RF magnetic field; and
a support member configured to support the plurality of RF coil elements so that at least one of the plurality of RF coil elements is movable independently in each of a circumferential direction and a length direction in response to a predicted specific absorption rate (SAR) of a target.
2. The RF coil device of claim 1, wherein the support member has a cylindrical shape and is configured to be disposed on an inner surface of a cylindrical housing of a magnetic resonance imaging (MRI) apparatus; and
the plurality of RF coil elements is arranged along a circumference of the support member.
3. The RF coil device of claim 2, wherein the support member is further configured to support the plurality of RF coil elements so that the at least one of the plurality of RF coil elements is movable along the circumference of the support member to adjust spacings on the circumference between the at least one of the plurality of RF coil elements and other ones of the plurality of RF coil elements that neighbor the at least one of the plurality of RF coil elements.
4. The RF coil device of claim 2, wherein the support member is further configured to support the plurality of RF coil elements so that the at least one of the plurality of RF coil elements is detachable from the support member.
5. The RF coil device of claim 2, wherein each of the plurality of RF coil elements comprises a conductor extending in the length direction of the cylindrical housing.

6. The RF coil device of claim 2, wherein each of the at least one of the plurality of RF coil elements comprises a plurality of sub-elements arranged in the length direction of the cylindrical housing; and the support member is further configured to support the plurality of sub-elements so that at least one of the plurality of sub-elements of each of the at least one of the plurality of RF coil elements is movable in the length direction.

7. The RF coil device of claim 1, wherein the support member has a cylindrical or semicylindrical shape configured to surround a part of a target; and the plurality of RF coil elements is arranged along a circumference of the support member.

8. The RF coil device of claim 7, wherein the support member is further configured to support the plurality of RF coil elements so that the at least one of the plurality of RF coil elements is movable along the circumference of the support member to adjust spacings on the circumference between the at least one of the plurality of RF coil elements and other ones of the plurality of RF coil elements that neighbor the at least one of the plurality of RF coil elements.

9. The RF coil device of claim 1, wherein the support member comprises a plurality of support blocks configured to support respective ones of the plurality of RF coil elements; and the plurality of support blocks is connected together to form a two-dimensional surface configured to cover a part of a target.

10. The RF coil device of claim 9, wherein at least one of the plurality of support blocks is connected to at another one of the plurality of support blocks so that a spacing between the at least one of the plurality of support blocks and the other one of the plurality of support blocks on the two-dimensional surface of the support member is adjustable.

11. The RF coil device of claim 9, wherein at least one of the plurality of support blocks is connected to another one of the plurality of support blocks so that a distance between the at least one of the plurality of support blocks and the target is adjustable.

12. The RF coil device of claim 1, wherein the plurality of RF coil elements is further configured to be independently operable in a multi-channel coil mode.

13. The RF coil device of claim 1, further comprising a driver and controller configured to drive and control the plurality of RF coil elements;

wherein the driver and controller is further configured to independently control a magnitude and a phase of power input to the plurality of RF coil based on positions of the plurality of RF coil elements relative to one another.

14. The RF coil device of claim 13, further comprising a probe configured to measure a strength of an RF magnetic field generated by the plurality of RF coil elements;

wherein the driver and controller is further configured to predict the specific absorption rate (SAR) of the target based on the strength of the RF magnetic field measured by the probe.

15. The RF coil device of claim 1, wherein the RF coils are moved in response to the predicted SAR being higher than a maximum permissible SAR.

16. A magnetic resonance apparatus, comprising:
a main magnet; and
a radio frequency (RF) coil device;

wherein the RF coil device comprises:
a plurality of RF coil elements configured to generate an RF magnetic field; and
a support member configured to support the plurality of RF coil elements so that at least one of the plurality of RF coil elements is movable independently in each of a circumferential direction and a length direction in response to a predicted specific absorption rate (SAR) of a target.

17. The magnetic resonance apparatus of claim 16, wherein the magnetic resonance apparatus is a magnetic resonance imaging apparatus or a magnetic resonance spectroscopy apparatus.

18. A method of driving and controlling a radio frequency (RF) coil device, the RF coil device comprising a plurality of RF coil elements configured to generate an RF magnetic field, and a driver and controller configured to drive and control the plurality of RF coil elements to be moveable independently in each of a circumferential direction and a length direction, the method comprising: the method comprising:

predicting a specific absorption rate (SAR) of a target with the plurality of RF coil elements positioned at basic positions; and adjusting a position of at least one of the plurality of RF coil elements independently in at least one of the circumferential direction and the length direction in response to the predicted SAR being higher than a maximum permissible SAR.

19. The method of claim 18, further comprising predicting an SAR of the target with the at least one of the plurality of RF coil elements at the adjusted position.

20. The method of claim 18, wherein the adjusting of a position of the at least one of the plurality of RF coil elements comprises adjusting a distance between the at least one of the plurality of RF coil elements and the target.

21. The method of claim 18, wherein the adjusting of a position of the at least one of the plurality of RF coil elements comprises adjusting a spacing between the at least one of the plurality of RF coil elements and at least one other one of the plurality of RF coil elements that neighbors the at least one of the plurality of RF coil elements.

22. A radio frequency (RF) coil device, comprising:
a plurality of RF coil elements configured to have a configuration changeable by independently moving the RF coil elements, the RF coil elements being configurable in circumferential and length directions, and configured to generate an RF magnetic field in response to a predicted specific absorption rate (SAR)of a target.

23. The RF coil device of claim 22, wherein at least one of the plurality of RF coil elements is configured to be movable to change the configuration of the plurality of RF coil elements.

24. The RF coil device of claim 22, wherein at least one of the plurality of RF coil elements is configured to be detachable from the RF coil device to change the configuration of the plurality of RF coil elements.

25. The RF coil device of claim 22, wherein the changeable configuration of the plurality of RF coil elements enables a specific absorption rate (SAR) of a target produced by the RF magnetic field generated by the plurality of coil elements to be adjusted by changing the configuration of the plurality of RF coil elements.

* * * * *